(12) United States Patent
Tran et al.

(10) Patent No.: US 6,651,208 B1
(45) Date of Patent: Nov. 18, 2003

(54) METHOD AND SYSTEM FOR MULTIPLE COLUMN SYNDROME GENERATION

(75) Inventors: Phuc Thanh Tran, Milpitas, CA (US); Thien-Phuc Nguyen Do, San Jose, CA (US); Tom Vu, San Jose, CA (US)

(73) Assignee: Mosel Vitelic Corporation, San Jose, CA (US)

( * ) Notice: Subject to any disclaimer, the term of this patent is extended or adjusted under 35 U.S.C. 154(b) by 0 days.

(21) Appl. No.: 09/542,893

(22) Filed: Apr. 4, 2000

(51) Int. Cl.[7] .......................... H03M 13/29; G11B 20/18
(52) U.S. Cl. ...................... 714/755; 714/763; 714/785
(58) Field of Search .............................. 714/755, 763, 714/769, 784, 785

(56) References Cited

U.S. PATENT DOCUMENTS

| | | | |
|---|---|---|---|
| 5,600,364 A | | 2/1997 | Hendricks et al. ............. 348/1 |
| 5,715,262 A | * | 2/1998 | Gupta .......................... 714/784 |
| 5,974,580 A | * | 10/1999 | Zook et al. ................... 714/755 |
| 5,996,105 A | * | 11/1999 | Zook ............................ 714/755 |
| 6,032,283 A | * | 2/2000 | Meyer ......................... 714/746 |
| 6,115,837 A | * | 9/2000 | Nguyen et al. ............. 714/756 |
| 6,158,038 A | * | 12/2000 | Yamawaki et al. ......... 714/752 |
| 6,158,040 A | * | 12/2000 | Ho .............................. 341/94 |
| 6,163,871 A | * | 12/2000 | Yang .......................... 714/765 |
| 6,279,135 B1 | * | 8/2001 | Nguyen et al. ............. 714/756 |

FOREIGN PATENT DOCUMENTS

| | | |
|---|---|---|
| WO | 9821877 | 5/1998 |
| WO | 9828906 | 7/1998 |
| WO | 9901984 | 1/1999 |
| WO | 9966719 | 12/1999 |

* cited by examiner

*Primary Examiner*—Stephen M. Baker
(74) *Attorney, Agent, or Firm*—Sawyer Law Group LLP

(57) ABSTRACT

The present invention provides a method and system for syndrome generation for data from an optical media. The method includes reading data bytes for a plurality of columns of a row of the data; reading a plurality of partial syndromes from a memory, each of the plurality of partial syndromes corresponding to one of the plurality of columns; updating each of the plurality of partial syndromes with the data byte of the corresponding column; and writing the plurality of updated partial syndromes into the memory. The present invention obtains data bytes for multiple columns at one time. Syndrome generation is then performed for each column, with the partial syndromes for each column stored in a memory. As the data bytes of subsequent rows of data for multiple columns are obtained, the partial syndromes for each column are read from the memory and loaded into a syndrome generation logic, thus updating the partial syndrome for each column. The updated syndromes are written back into the memory. This continues until the syndromes for all of the rows for the multiple columns have been generated. By storing partial syndromes in a memory, multiple sets of syndrome generation logic is not needed to simultaneously process multiple columns of data bytes, thus avoiding a space penalty for the controller. Since multiple columns are read at one time, fewer clock cycles are required to access the data bytes, saving time. Therefore, clock cycle penalties are decreased while also avoiding a space penalty for the controller.

12 Claims, 7 Drawing Sheets

METHOD AND SYSTEM FOR MULTIPLE COLUMN SYNDROME GENERATION

FIELD OF THE INVENTION

The present invention relates to optical media, and more particularly to syndrome generation in decoding data from an optical medium.

BACKGROUND OF THE INVENTION

According to a standard in the industry, data from optical media is stored in a rows and columns format. FIG. 1 illustrates the data format for Digital Video Disc (DVD) according to a standard in the industry. As illustrated, the data is stored in a 208 rows×172 columns table format. Each intersection of row and column is a byte of the data. The data is read from the DVD by rows. Thus, bytes in row $R_0$ are first read sequentially from columns $C_0$ through $C_{171}$, then the bytes in row $R_1$ are read sequentially from columns $C_0$ through $C_{171}$, etc. Typically, six clock cycles are required to read the first byte, and one clock cycle is required to read each subsequent contiguous byte. Reading data in this manner is according to the standard in the industry and is very well known.

Read data is then decoded. Part of the decoding process is error correction, which is well known in the art as the Error Correction Code (ECC) process. The ECC process is performed in rows and columns. In other words, the bytes in column $C_0$ are first corrected. Then the bytes in column $C_1$ are corrected, etc. For each column, the bytes are processed by a standard syndrome generation logic, the result of which is then checked for errors by a syndrome checking process. The syndrome checking process is well known and standard in the art, and thus will not be described in detail here.

However, although the ECC is performed by columns, the data is not read sequentially by columns but by rows. To obtain columns of bytes, a jump must be made from a column's byte in one row to the column's byte in another row. Typically, in addition to the six clock cycles required to read the first byte, another six clock cycles are required to jump and read the next byte in the same column. This is in contrast to the one clock cycle required if the bytes were sequential. Thus, with each byte read for ECC, a five clock cycle penalty is incurred.

One conventional method of limiting the clock cycle penalty is to process multiple columns at the same time. To do this, the syndrome generation logic is duplicated, one set for each column. However, the logic requires significant space on the optical drive's controller. Thus, although some clock cycle penalty is saved, a significant cost in space is incurred.

Accordingly, there exists a need for an improved method and system for multiple column syndrome generation for optical media. The method and system should reduce the clock cycle penalty while also avoiding a space penalty for the controller. The present invention addresses such a need.

SUMMARY OF THE INVENTION

The present invention provides a method and system for syndrome generation for data from an optical media. The method includes reading data bytes for a plurality of columns of a row of the data; reading a plurality of partial syndromes from a memory, each of the plurality of partial syndromes corresponding to one of the plurality of columns; updating each of the plurality of partial syndromes with the data byte of the corresponding column; and writing the plurality of updated partial syndromes into the memory. The present invention obtains data bytes for multiple columns at one time. Syndrome generation is then performed for each column, with the partial syndromes for each column stored in a memory. As the data bytes of subsequent rows of data for multiple columns are obtained, the partial syndromes for each column are read from the memory and loaded into a syndrome generation logic, thus updating the partial syndrome for each column. The updated syndromes are written back into the memory. This continues until the syndromes for all of the rows for the multiple columns have been generated. By storing partial syndromes in a memory, multiple sets of syndrome generation logic are not needed to simultaneously process multiple columns of data bytes, thus avoiding a space penalty for the controller. Since multiple columns are read at one time, fewer clock cycles are required to access the data bytes, saving time. Therefore, clock cycle penalties are decreased while also avoiding a space penalty for the controller.

BRIEF DESCRIPTION OF THE FIGURES

Figure 1:
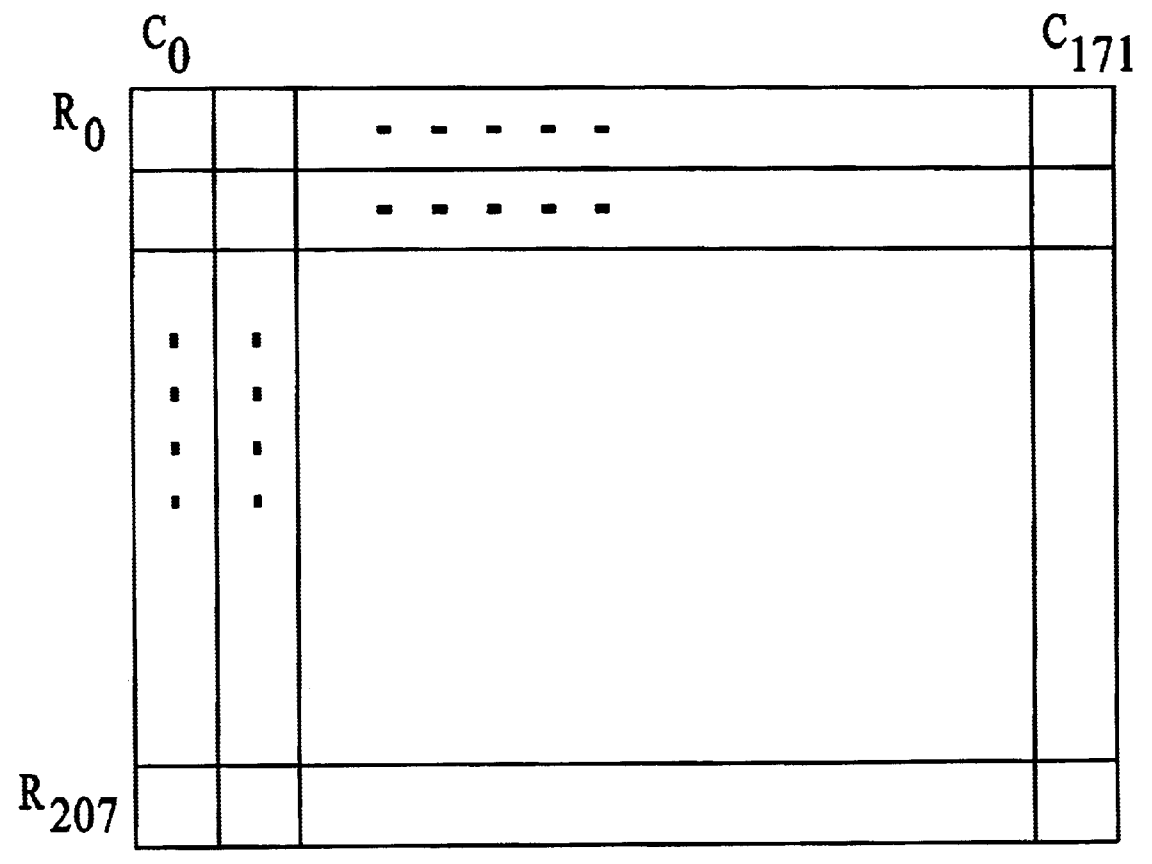

FIG. 1 illustrates the data format for Digital Video Disc (DVD) according to a standard in the industry.

DETAILED DESCRIPTION

The present invention provides an improved method and system for multiple column syndrome generation for optical media. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

In the method and system in accordance with the present invention, syndrome generation is simultaneously performed for multiple columns of data. The present invention obtains data bytes for multiple columns at one time. Syndrome generation is then performed for each column, with the partial syndromes for each column stored in a memory. As the data bytes of subsequent rows of data for the multiple columns are obtained, the partial syndromes for each column are read from the memory and loaded into the syndrome generation logic, thus updating the partial syndrome for each column. The updated syndromes are written back into the memory. This continues until the syndromes for all of the rows for the multiple columns have been generated.

To more particularly describe the features of the present invention, please refer to FIGS. 2 through 7 in conjunction with the discussion below.

Figure 2:
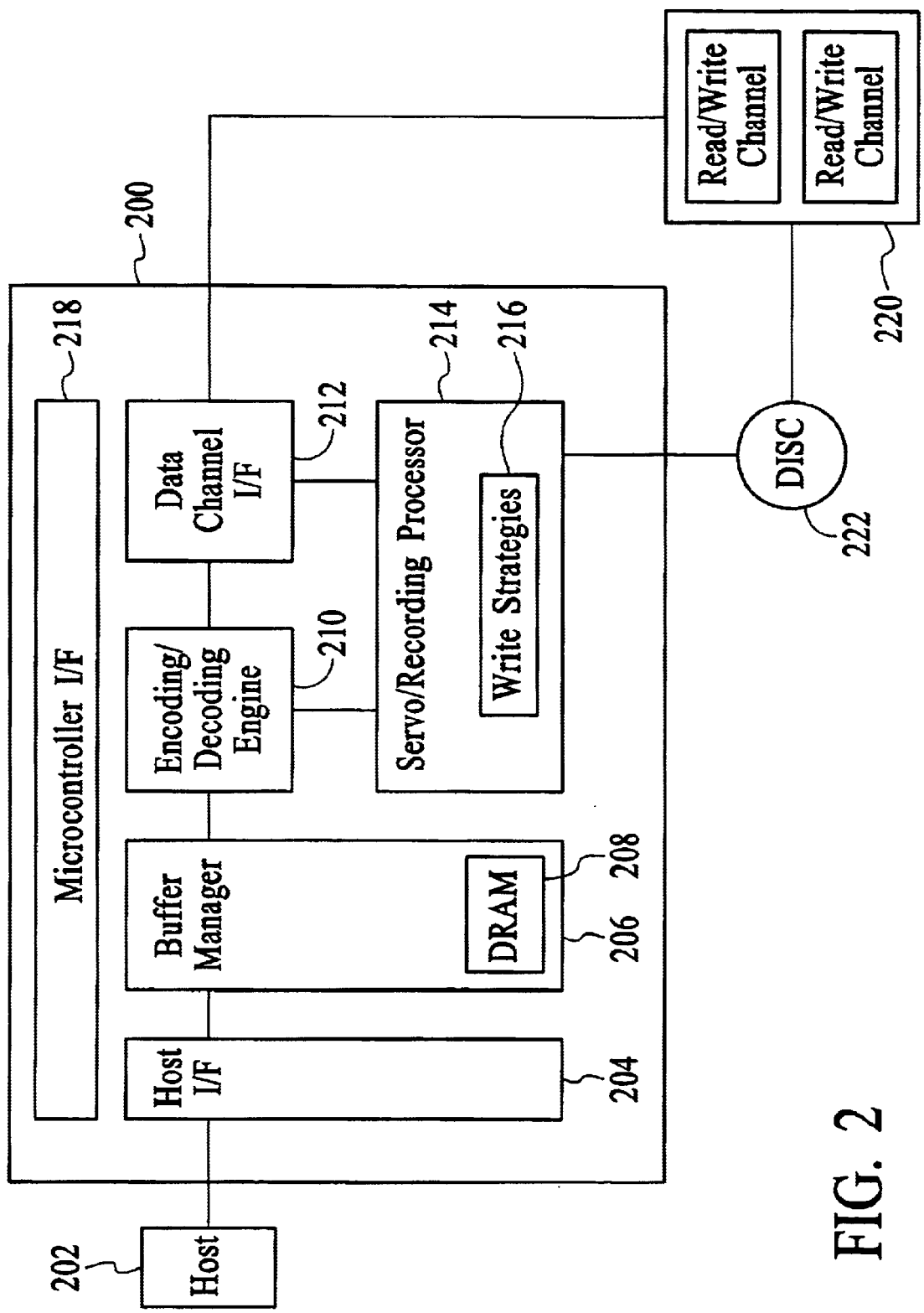
FIG. 2 is a block diagram illustrating a preferred embodiment of a controller which may use the method and system in accordance with the present invention.

FIG. 2 is a block diagram illustrating a preferred embodiment of a controller which may use the method and system in accordance with the present invention. The elements 204–218 represent the logical architecture of the controller 200. The controller 200 comprises a host interface 204, a buffer manager 206 with an embedded memory 208, an integrated encoding/decoding engine 210, a data channel interface 212, an integrated servo/recording processor 214 embedded with the write strategies 216, and a microcontroller interface 218. In the preferred embodiment, the embedded memory 208 is an embedded dynamic random access memory (DRAM). The integrated servo/recording processor 214 provides the mechanical control of the disc 220 and the spindle and sledge (not shown) of the drive for both reading and writing of data. The servo/recording processor 214 interfaces with the disc 222 in the writing of data. Integrated into the processor 214 are the write strategies 216 which controls the writing of the data so that they data is in a standard format. The write control logic in accordance with the present invention would be part of the servo/recording processor 214 for controller 200. The controller 200 is further described in co-pending U.S. patent application entitled "Integrated Controller To Process Both Optical Reads And Optical Writes Of Multiple Optical Media", Ser. No. 09/652,254, filed on Aug. 30, 2000. Applicant hereby incorporates this patent application by reference.

Figure 3:
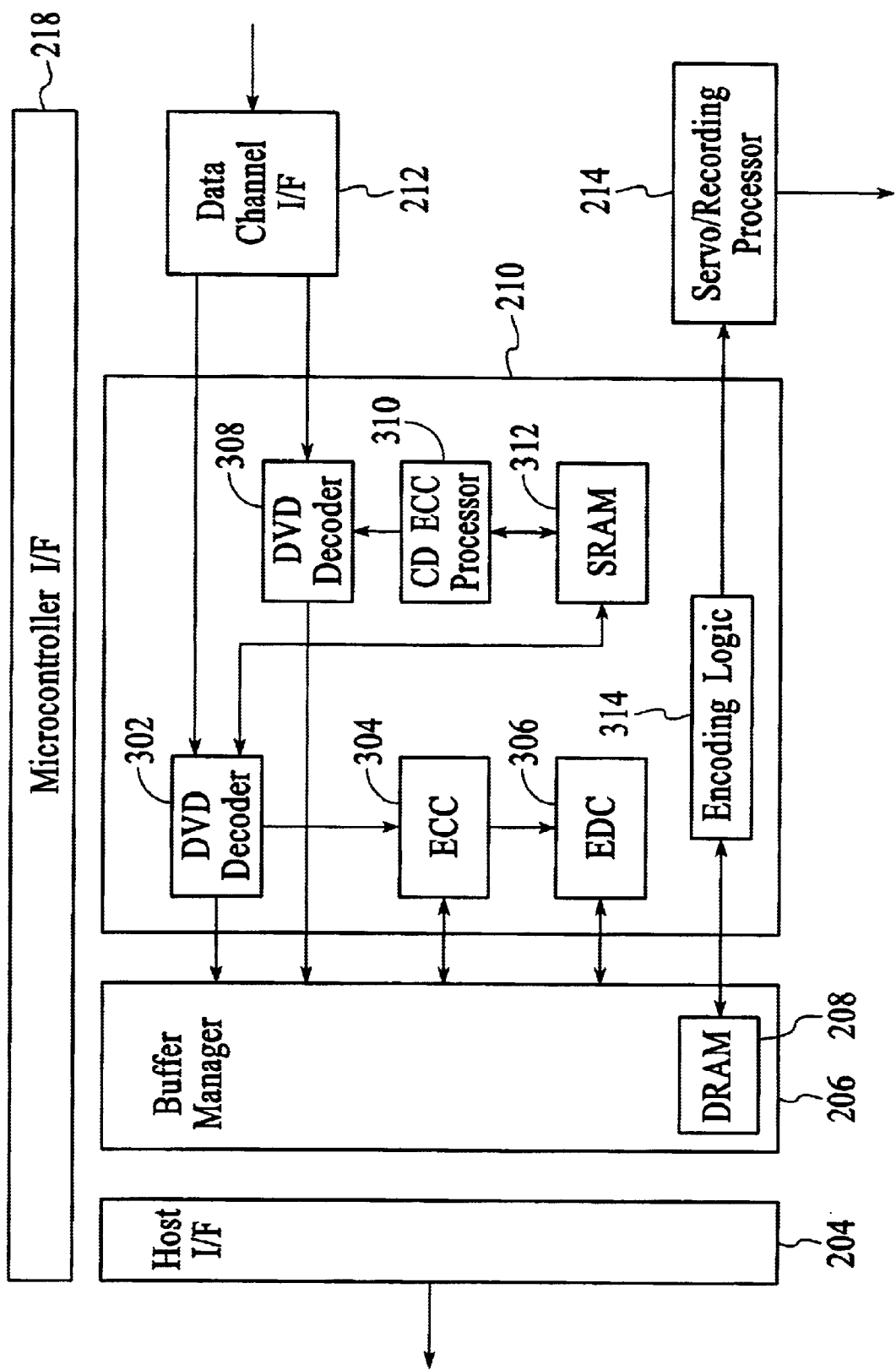
FIG. 3 illustrates in more detail the integrated encoding/decoding engine of the controller which may use the method and system in accordance with the present invention.

FIG. 3 illustrates in more detail the integrated encoding/decoding engine of the controller which may use the method and system in accordance with the present invention. The encoding of data is performed by the encoding logic 314 of the encoding/decoding engine 210. In decoding, the encoding/decoding engine 210 receives demodulated data from the data channel interface 212. The demodulated data is decoded by the CD decoder 308 or DVD decoder 302, depending on the format of the data. When the format is CD-based, the C1 and C2 encoding processes are decoded by the CD ECC processor 310. If the data is also C3 encoded, and this is decoded as well. C1, C2, and C3 refer to standard encoding processes for encoding additional information into the data for use in correction of errors which may exist after decoding. The Static Random Access Memory 312 (SRAM) is used by the CD ECC processor 310 as intermediate storage. If the media is DVD-based, then the SRAM 312 is used for the syndrome generation process as described below.

In decoding, the interleaved state of the data from the C2 encoding process is reversed. Errors in the decoding are then corrected by the error correction code 304 (ECC) using the information encoded by the C1 encoding process. The corrected data is then checked by the error detection code 306 (EDC) using the information encoded by the C3 encoding process. If an error still exist, then the process returns to the ECC 304, and then the EDC 306, until no further errors exist.

Figure 4:
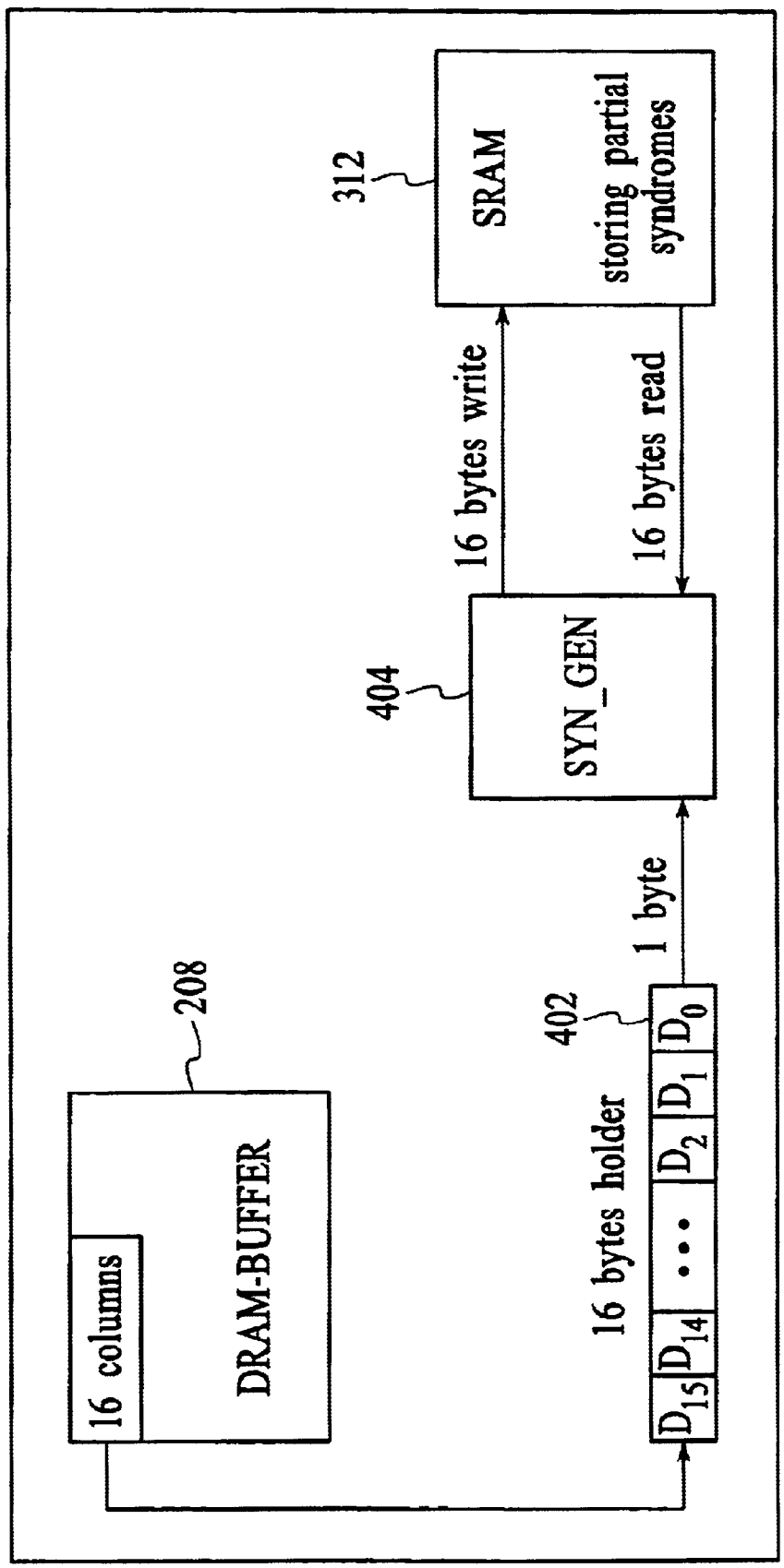
FIG. 4 is a block diagram illustrating a preferred embodiment of the multiple column sydrome generation process in accordance with the present invention.
Figure 5:
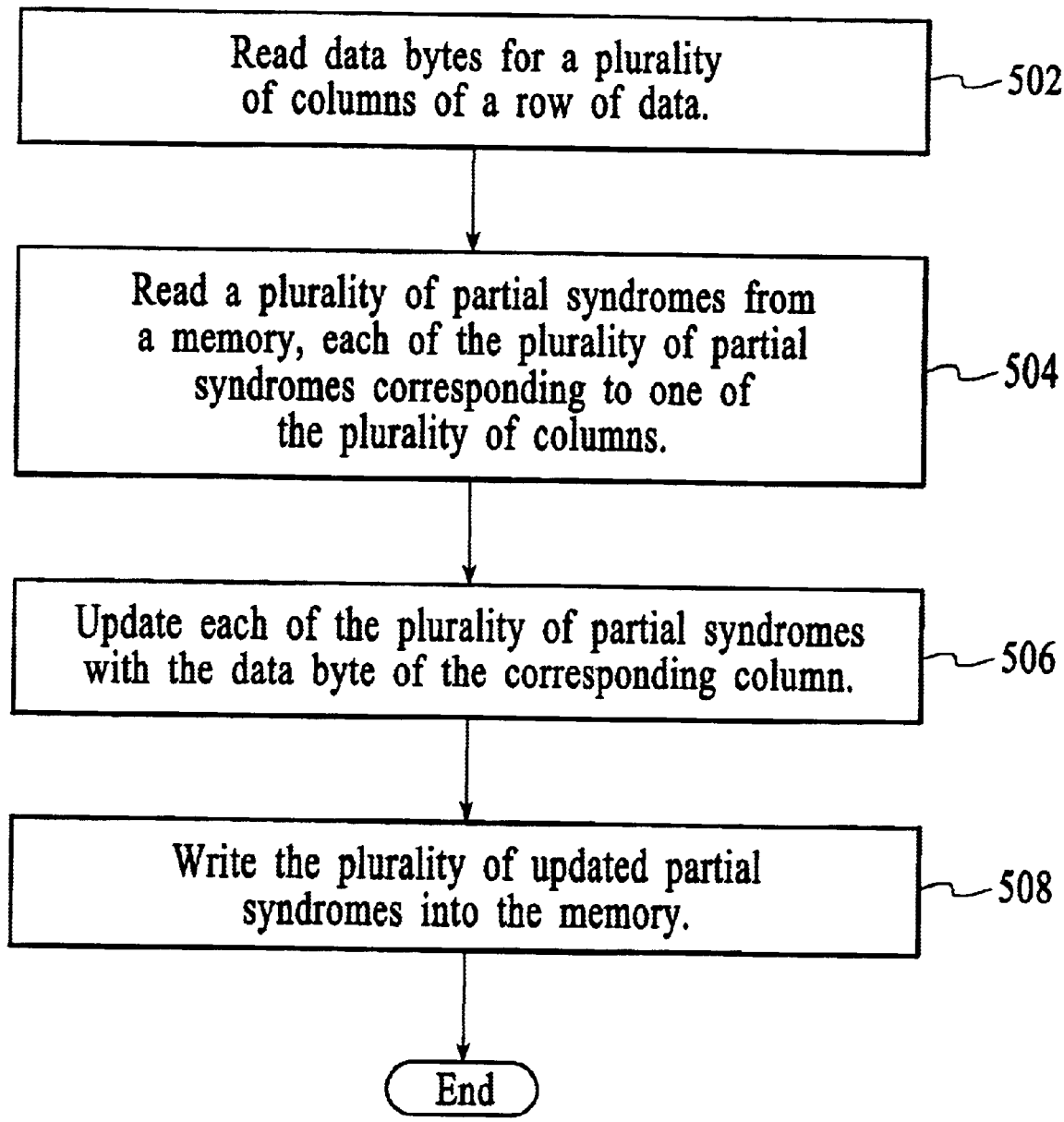
FIG. 5 is a flowchart illustrating a preferred embodiment of the multiple column syndrome generation process in accordance with the present invention.

FIG. 4 is a block diagram illustrating a preferred embodiment of the multiple column syndrome generation process in accordance with the present invention. The process involves the DRAM 208, a holder 402, one set of syndrome generation logic 404, and the SRAM 312. FIG. 5 is a flowchart illustrating a preferred embodiment of the multiple column syndrome generation process in accordance with the present invention. When data is read from the optical media, it is first buffered in the DRAM 208. Then, data bytes for a plurality of columns of a row of data is read from the DRAM 208, via step 502, and placed into the holder 402. In the preferred embodiment, sixteen bytes are obtained at a time. Each byte in the holder 402 represents one data symbol of a given column. For example, $D_0$ corresponds to the data symbol in column 0, and $D_1$ corresponds to the data symbol in column 1, etc. Next, a plurality of partial syndromes from the SRAM 312 are read, via step 504. Each of the plurality of partial syndromes correspond to one of the plurality of columns in the holder 402. Each of the plurality of partial syndromes are then updated with the data byte of the corresponding column, via step 506, by the syndrome generation logic 404. The partial syndrome for a column is the result of syndrome calculations from previous rows of the column. The plurality of updated partial syndromes are then written, or stored, back into the SRAM 312, via step 508.

Figure 6:
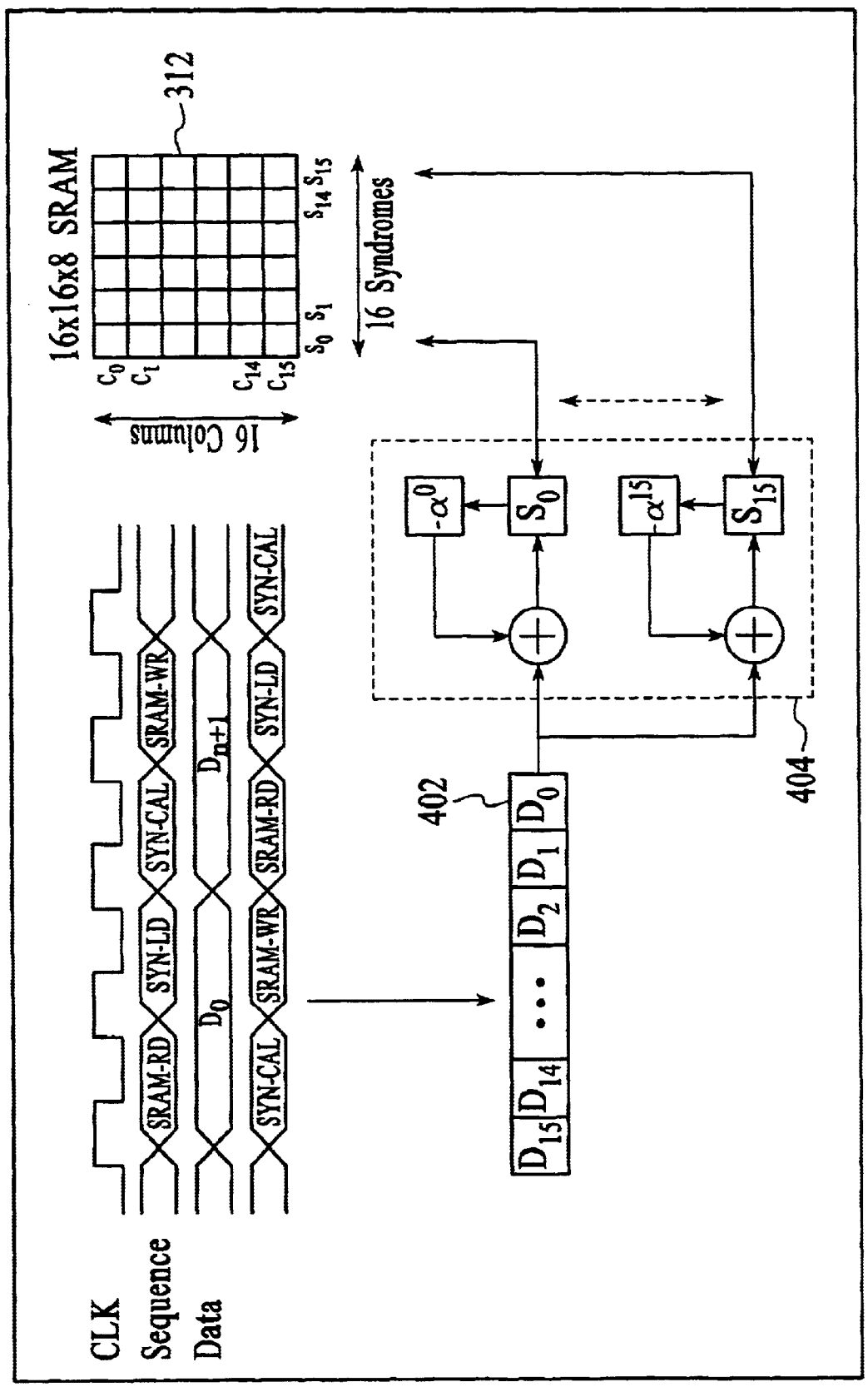
FIG. 6 is a block diagram illustrating in more detail the preferred embodiment of the multiple column syndrome generation scheme in accordance with the present invention.
Figure 7:
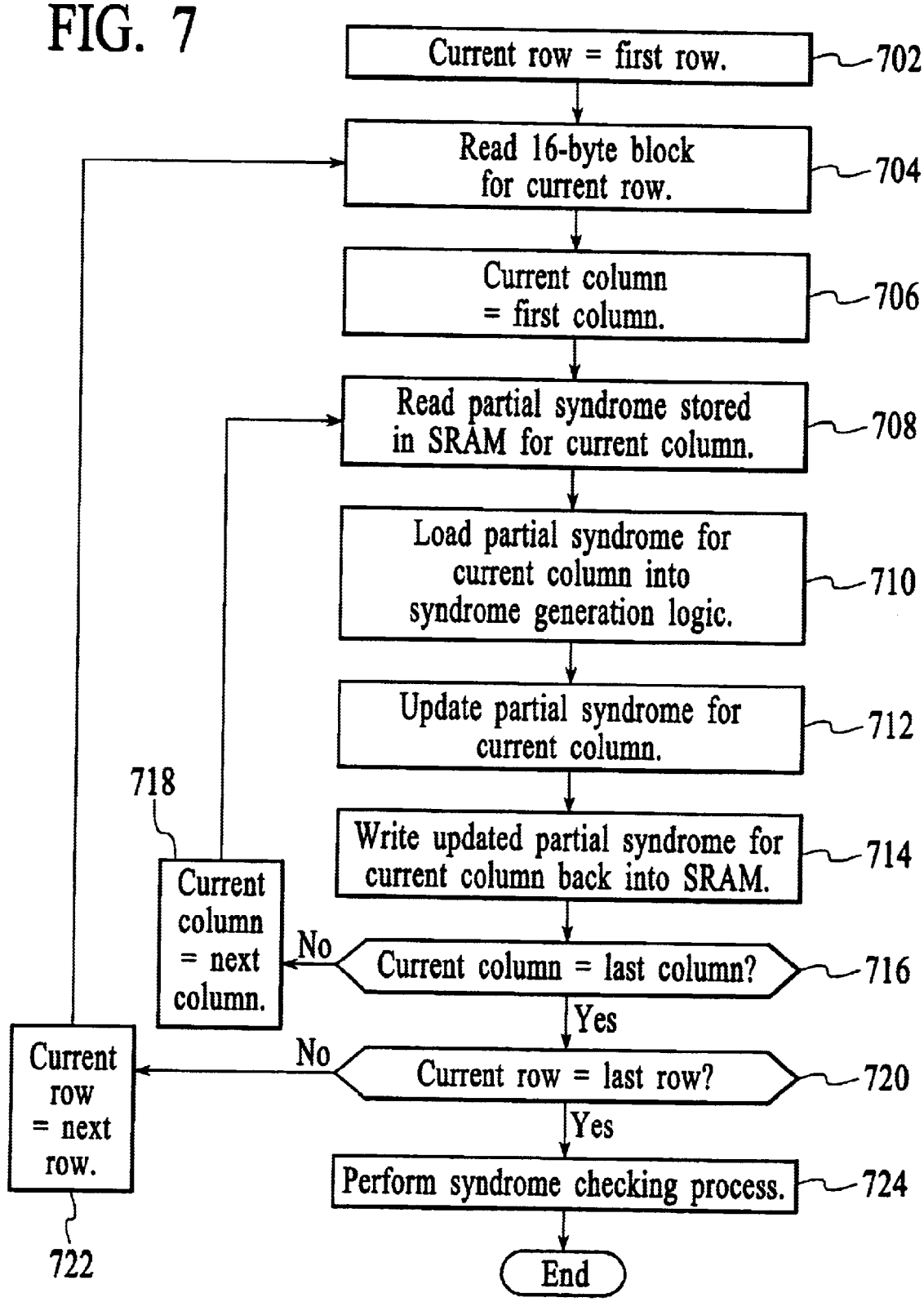
FIG. 7 is a flowchart illustrating in more detail the preferred embodiment of the multiple column syndrome generation scheme in accordance with the present invention.

FIGS. 6 and 7 are a block diagram and a flowchart, respectively, illustrating in more detail the preferred embodiment of the multiple column syndrome generation scheme in accordance with the present invention. Column syndrome generation starts when data is requested from the DRAM 208, and a single data byte for multiple columns in the first row are read at once, via steps 702 and 704. In the preferred embodiment, data bytes for 16 columns are read at once. The 16 bytes are placed in the 16-byte holder 402. Starting with the first column as the current column, via step 706, the partial syndrome for the current column stored in the SRAM 312 is read, via step 708. The partial syndrome is loaded into the registers, $S_0$ through $S_{15}$, of the syndrome generation logic 404, via step 710. The partial syndrome for the current column is then updated, via step 712. The updated partial syndrome is calculated by the syndrome generation logic 404 based upon the partial syndrome from previous rows of the current column and the byte in the current row for the current column. The updated partial syndrome for the current column is written back into the SRAM 312, via step 714. In the preferred embodiment, the SRAM 312 is large enough to store 16 partial syndromes for each of the 16 columns, or 256 8-bit locations. If the current column is not the last column for the data bytes, as determined via step 716, then steps 708 through 716 are repeated for the next column, via step 718. This continues until the current column is the last column. The syndrome generation is thus complete for the columns in the current row. Steps 704 through steps 720 are repeated until the current row is the last row, via steps 720 and 722. Once all of the syndromes for the 16 columns have been calculated, all of the calculated syndromes are checked for errors, via step 724. Then, the next set of 16 column syndromes, i.e., for data bytes in columns 16 through 31, are generated according to the scheme illustrated in FIGS. 6 and 7. This continues until the column syndromes for all 172 columns have been generated.

With the exception of the first data byte of each column, the syndrome generation process in accordance with the present invention requires three clock cycles for each column. In the first clock cycle, the partial syndromes stored in the SRAM 312 is read, via step 708. In the second clock cycle, the partial syndrome of the column, for example column 2, is loaded from the SRAM 402 into the registers of the syndrome generation logic 404, via step 710. At the same time, the partial syndrome of the previous column, column 1 is written into the SRAM 312. In the third clock cycle, the partial syndrome for the current column, column 2, is updated, via step 712. The updated partial syndrome for column 2 is written into the SRAM 312, via step 714, during the next second clock cycle.

Although the syndrome generation process in accordance with the present invention is described in the context of DVD-based media, the process may be applied to other media, such as CD-based media, without departing from the spirit and scope of the present invention. Although the present invention is described as using an existing memory, i.e., the SRAM 312, to store partial syndromes, other memories, such as a dedicated memory or an external memory, may be used without departing from the spirit and scope of the present invention. Although the present invention is described as accessing 16-bytes of data at one time, any number of multiple bytes may be accessed without departing from the spirit and scope of the present invention. Although the present invention is described in the context of the controller illustrated in FIGS. 2 and 3, it may be used by any other controller for optical media without departing from the spirit and scope of the present invention.

An improved method and system for multiple column syndrome generation for optical media has been disclosed. The present invention obtains data bytes for multiple columns at one time. Syndrome generation is then performed for each column, with the partial syndromes for each column stored in a memory. As the data bytes of subsequent rows of data for multiple columns are obtained, the partial syndromes for each column are read from the memory and loaded into a syndrome generation logic, thus updating the partial syndrome for each column. The updated syndromes are written back into the memory. This continues until the syndromes for all of the rows for the multiple columns have been generated. By storing partial syndromes in a memory, multiple sets of syndrome generation logic is not needed to simultaneously process multiple columns of data bytes, thus avoiding a space penalty for the controller. Since multiple columns are read at one time, fewer clock cycles are required to access the data bytes, saving time. Therefore, clock cycle penalties are decreased while also avoiding a space penalty for the controller.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for syndrome generation for data from an optical media, comprising the steps of:
    (a) reading data bytes for a plurality of columns of a row of the data;
    (b) reading a plurality of partial syndromes from a memory, each of the plurality of partial syndromes corresponding to one of the plurality of columns;
    (c) updating each of the plurality of partial syndromes with the data byte of the corresponding column; and
    (d) writing the plurality of updated partial syndromes into the memory.

2. The method of claim 1, wherein the reading step (b) comprises:
    (b1) reading a partial syndrome stored in the memory for a current column of the plurality of columns; and
    (b2) loading the partial syndrome for the current column into a syndrome generation logic.

3. The method of claim 1, wherein the updating step (c) comprises:
    (c1) updating a partial syndrome for a current column of the plurality of columns.

4. The method of claim 1, wherein the writing step (d) comprises:
    (d1) writing an updated partial syndrome for a current column of the plurality of columns into the memory.

5. The method of claim 4, further comprising:
    (e) determining if the current column is a last column of the plurality of columns; and
    (f) repeating steps (b) through (e) for a next column of the plurality of columns, if the current column is not the last column.

6. The method of claim 5, further comprising:
    (g) determining if a current row of the data is a last row of the data; and
    (h) repeating steps (a) through (f) for a next row of the data, if the current row is not the last row, wherein if the current row is the last row, then a plurality of syndromes have been generated for the plurality of columns.

7. The method of claim 6, further comprising:
    (i) performing syndrome checking on the plurality of syndromes of the plurality of columns.

8. A method for syndrome generation for data from an optical media, comprising the steps of:
    (a) reading data bytes for a plurality of columns for a current row of the data;
    (b) reading a partial syndrome stored in a memory for a current column of the plurality of columns;
    (c) loading the partial syndrome for the current column into a syndrome generation logic;
    (d) updating the partial syndrome for the current column;
    (e) writing the updated partial syndrome for the current column into the memory;
    (f) determining if the current column is a last column of the plurality of columns;
    (g) repeating steps (b) through (f) for a next column of the plurality of columns, if the current column is not the last column;
    (h) determining if the current row is a last row of the data; and
    (i) repeating steps (a) through (h) for a next row of the data, if the current row is not the last row, wherein if the current row is the last row, then a plurality of syndromes have been generated for the plurality of columns.

9. A system for syndrome generation of data from an optical media, comprising:
    a holder for holding data bytes for a plurality of columns of a row of the data;
    a syndrome generation logic coupled to the holder for generating partial syndromes for the plurality of columns, wherein the partial syndromes result from syndrome calculations from previous rows of the plurality of columns; and
    a memory coupled to the syndrome generation logic for storing the partial syndromes generated by the syndrome generation logic for the plurality of columns.

10. A controller of an optical drive, comprising:
    a data channel interface for receiving data from an optical media; and a decoding engine, comprising:
- a holder for holding data bytes for a plurality of columns of a row of the data,
- a syndrome generation logic coupled to the holder for generating partial syndromes for the plurality of columns, wherein the partial syndromes result from syndrome calculations from previous rows of the plurality of columns, and
- a memory coupled to the syndrome generation logic for storing the partial syndromes generated by the syndrome generation logic for the plurality of columns.

11. An optical drive, comprising:

an apparatus for reading data from an optical media; and a controller, comprising:
- a data channel interface for receiving data from an optical media, and
- a decoding engine, comprising:
  - a holder for holding data bytes for a plurality of columns of a row of the data,
  - a syndrome generation logic coupled to the holder for generating partial syndromes for the plurality of columns, wherein the partial syndromes result from syndrome calculations from previous rows of the plurality of columns, and
  - a memory coupled to the syndrome generation logic for storing the partial syndromes generated by the syndrome generation logic for the plurality of columns.

12. A system for syndrome generation of data from an optical media, comprising:

means for reading data bytes for a plurality of columns of a row of the data;

means for reading a plurality of partial syndromes from a memory, each of the plurality of partial syndromes corresponding to one of the plurality of columns;

means for updating each of the plurality of partial syndromes with the data byte of the corresponding column; and means for writing the plurality of updated partial syndromes into the memory.

* * * * *